United States Patent
Kim et al.

(10) Patent No.: US 7,778,084 B2
(45) Date of Patent: Aug. 17, 2010

(54) NON-VOLATILE MEMORY DEVICES AND OPERATING METHODS THEREOF

(75) Inventors: Moo-Sung Kim, Yongin-si (KR); Ki-Hwan Choi, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 353 days.

(21) Appl. No.: 12/071,011

(22) Filed: Feb. 14, 2008

(65) Prior Publication Data

US 2008/0205160 A1 Aug. 28, 2008

(30) Foreign Application Priority Data

Feb. 27, 2007 (KR) .................. 10-2007-0019767

(51) Int. Cl.
*G11C 16/06* (2006.01)
(52) U.S. Cl. .................. 365/185.22; 365/185.17; 365/185.23
(58) Field of Classification Search .......... 365/185.22, 365/185.17, 185.23
See application file for complete search history.

(56) References Cited

U.S. PATENT DOCUMENTS

| | | | |
|---|---|---|---|
| 5,473,563 A | | 12/1995 | Suh et al. |
| 5,696,717 A | | 12/1997 | Koh |
| 7,266,019 B2 * | 9/2007 | Taoka et al. ............. | 365/185.29 |
| 7,369,433 B2 * | 5/2008 | Toda ..................... | 365/185.03 |
| 7,460,407 B2 * | 12/2008 | Mokhlesi et al. ....... | 365/185.22 |
| 7,468,919 B2 * | 12/2008 | Sekar et al. ............ | 365/185.27 |
| 7,518,920 B2 * | 4/2009 | Kang .................... | 365/185.17 |
| 2005/0254302 A1 * | 11/2005 | Noguchi ............... | 365/185.17 |
| 2006/0044919 A1 * | 3/2006 | Taoka et al. ............ | 365/230.03 |
| 2006/0072359 A1 | 4/2006 | Futatsuyama et al. | |
| 2006/0227613 A1 | 10/2006 | Joo | |
| 2007/0019467 A1 * | 1/2007 | Toda ....................... | 365/185.2 |
| 2008/0253181 A1 * | 10/2008 | Edahiro et al. ......... | 365/185.03 |
| 2009/0016143 A1 * | 1/2009 | Incarnati et al. ........ | 365/230.01 |
| 2009/0244976 A1 * | 10/2009 | Kajimoto ............... | 365/185.11 |

FOREIGN PATENT DOCUMENTS

| | | |
|---|---|---|
| JP | 2006-107577 | 4/2006 |
| JP | 2006-294205 | 10/2006 |
| KR | 10-2006-0008998 | 1/2006 |
| KR | 1020060051885 | 5/2006 |
| KR | 1020060066396 | 6/2006 |
| KR | 10-2006-0101898 | 9/2006 |
| KR | 1020060107697 | 10/2006 |

* cited by examiner

*Primary Examiner*—Tuan T. Nguyen
(74) *Attorney, Agent, or Firm*—Harness, Dickey & Pierce, P.L.C.

(57) ABSTRACT

Non-volatile memory devices and operating methods thereof are provided. In an operating method, a first operation is performed by applying a first voltage to at least one word line. The first operation includes one of a programming or erasing operation. The first operation is verified by applying a verify voltage to each of the at least one word lines. The voltage level of each verify voltage is determined according to position information of a corresponding one of the at least one word lines.

26 Claims, 7 Drawing Sheets

NON-VOLATILE MEMORY DEVICES AND OPERATING METHODS THEREOF

PRIORITY STATEMENT

This U.S. non-provisional patent application claims priority under 35 U.S.C. §119 to Korean Patent Application No. 10-2007-0019767, filed on Feb. 27, 2007, the entire contents of which are hereby incorporated by reference.

BACKGROUND

A conventional non-volatile memory device retains data stored in memory cells even without power. Among conventional non-volatile memory devices, a flash memory electrically erases data of a cell by a package, and thus, may be used in computers, memory cards, etc.

Conventional flash memories may be classified as a NOR type or a NAND type according to the manner in which cells and bit lines are connected. Conventional NOR type flash memories may consume more power than NAND type memories, but may also operate at higher speeds. Because of the higher power consumption, however, achieving a relatively high degree of integration may be more difficult, than in NAND type flash memories, which consume less power.

Figure 1:
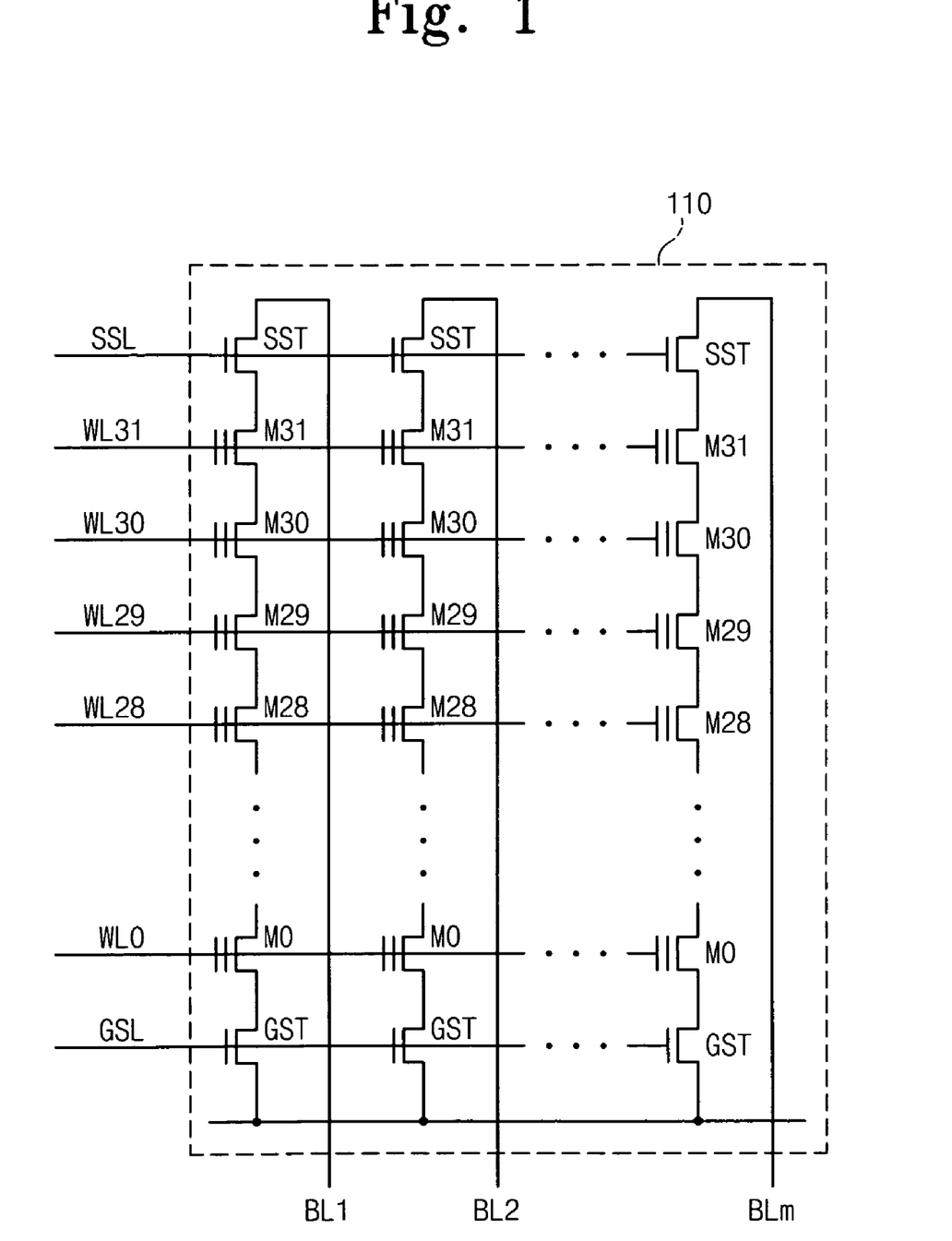
FIG. 1 is a view illustrating an array of a conventional NAND flash memory.

FIG. 1 illustrates an array 110 of a conventional NAND flash memory. The memory cell array 110 may constitute a storage region for storing data or information.

Referring to FIG. 1, the memory cell array 110 may include a plurality of blocks. Each of the blocks may include a plurality of cell strings. Each of the cell strings may include a plurality of floating gate transistors M0 to M31. In each string, the floating gate transistors M0 to M31 may be connected in series between a string select transistor SST and a ground select transistors GST. One of a plurality of bit lines BL1 to BLm may be connected to a terminal of a corresponding string select transistor SST.

A plurality of word lines WL0 to WL31 may be arranged to intersect the NAND strings. Each word lines WL0 to WL31 may be connected to control gates of floating gate transistors M0 to M31, respectively. When a program/read voltage is applied to word lines WL0 to WL31, data may be programmed into or read from the corresponding floating gate transistors M0 to M31. The flash memory may further include a buffer circuit (not shown) for storing data on the memory cell array 110 or reading the stored data from the memory cell.

As is well known, a memory cell of a conventional NAND flash memory utilizes Fowler-Nordheim (F-N) tunneling current to program and erase data.

Figure 2:
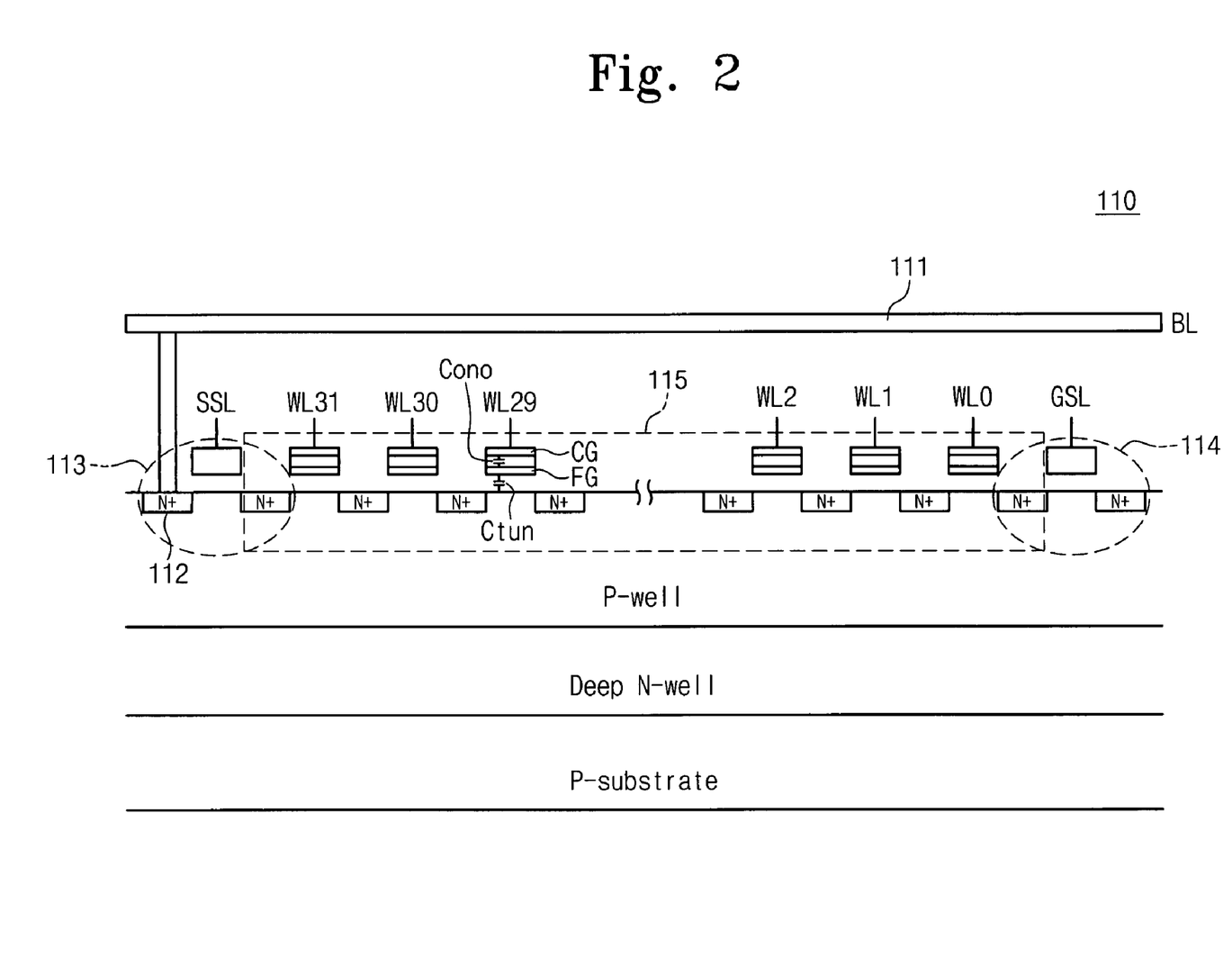
FIG. 2 is a sectional view of one cell string of FIG. 1.

FIG. 2 is a sectional view of a cell string of the conventional NAND flash memory shown in FIG. 1. Referring to FIG. 2, a cell string may include a bit line 111 connected to a drain 112, a string select transistor 113, a ground select transistor 114, and a plurality of (e.g., 32) NAND flash memory cells 115. Each cell of a NAND flash memory may include a control gate CG, a floating gate FG, a source and a drain in a bulk or a P-well. A channel between the drain and the source may be defined in the bulk or the P-well.

A dielectric layer having an oxide/nitride/oxide (ONO) structure with a relatively high storage capacity may be formed between the control gate CG and the floating gate FG. A tunnel oxide layer having a structure sufficient for F-N tunneling may be formed between the floating gate FG and the bulk. According to this cell structure, dielectric capacity CONO (via the dielectric layer) exists between the control gate CG and the floating gate FG. Tunnel capacity Ctun (via a tunnel oxide layer) also exists between the floating gate FG and the P-well. A voltage of the floating gate FG may be determined by a word line voltage VWL applied to the control gate CG and a coupling ratio of the capacities CONO and Ctun. The word line voltage VWL for a program/erase/read operation may be distributed by the above capacities.

In this example, the dielectric capacity CONO may include capacity components between the control gate CG and the floating gate FG and capacity components of adjacent transistors. Likewise, the tunnel capacity Ctun may include capacity components between the floating gate FG and the bulk and capacity components of adjacent transistors. An electric field between the floating gate FG and the bulk (or, P-well), which may cause F-N tunneling during a programming operation, depends on a word line voltage VWL distributed according to the sizes of the dielectric capacity CONO and the tunnel capacity Ctun. A voltage Vtun applied between the floating gate FG and the bulk may be expressed as Equation 1 shown below.

$$V_{tun} = V_{WL} \alpha_{couple} \qquad \text{Equation 1}$$

In Equation 1, $\alpha_{couple}$ represents a coupling ratio, which may be expressed as Equation 2 shown below.

$$\alpha_{couple} = \frac{C_{ono}}{C_{ono} + C_{tun}} \qquad \text{Equation 2}$$

As shown in Equations 1 and 2, the size of the tunneling voltage Vtun contributing to F-N tunneling may depend on the size of a coupling ratio $\alpha_{couple}$. But, forming memory cells with the same coupling ratio $\alpha_{couple}$ in the same string/row of a conventional NAND flash memory may be relatively difficult and/or impossible because, in each string, cells adjacent to the string select line SSL and the ground select line GSL may have a coupling ratio different from (e.g., higher or lower than) the rest of the cells.

As described above, the capacity of each cell may include a capacity component related to an adjacent cell/select transistor. According to a string structure, a capacity component between cells may be different from the capacity component between select transistors. As a result, even if the same voltage is applied to each word line, the floating gate voltage Vtun induced in cells adjacent to a string/ground select line SSL/GSL may be different from the floating gate voltage Vtun induced in the rest of the cells.

In conventional NAND flash memories, program/erase speeds of word lines (e.g., WL0 or WL31) adjacent to the string/ground select line SSL/GSL may be different (e.g., drastically or substantially different) from the rest of the word lines.

SUMMARY

Example embodiments provide non-volatile memory devices with improved operating (e.g., programming and erasing) speeds, and operating (e.g., programming and erasing) methods thereof.

According to at least one example embodiment, in a method of operating a non-volatile memory device, a first operation may be performed by applying a first voltage to at least one word line. The first operation may be one of a programming and erasing operation. The first operation may be verified by applying a verify voltage to each of the at least one word lines. Voltage levels of the at least one verify voltages may be determined based on position information of a corresponding one of the at least one word lines.

According to at least one other example embodiment, a program operation may be performed by applying a program voltage to a word line. A verify operation may be performed by applying a verify voltage to the word line. The verify voltage may have a voltage level determined according to position information associated with the word line.

In at least some example embodiments, a voltage level of the program voltage may be increased when the program operation is determined to have failed. The increasing of the voltage level may be performed after the program voltage has been applied. The non-volatile memory device may be a NAND flash memory including a string having a plurality of word lines. The plurality of word lines may be divided into a first word line group and a second word line group. The first word line group may include at least one word line, wherein each of the at least one word lines is not adjacent to a string select line or a ground select line. The second word line group may include at least one word line, wherein each of the at least one word lines is adjacent to the string select line or the ground select line. The second word line group may have a program speed different from (e.g., faster or slower than) the program speed of the first word line group. A verify voltage of the second word line group may be different from (e.g., lower than) a verify voltage of the second word line group by a given voltage.

At least one other example embodiment provides a method of erasing a non-volatile memory device. In at least this example embodiment, an erase operation may be performed by applying an erase voltage to a plurality of word lines. The erasing operation may be verified by applying a different verify voltage to each of at least a portion of the word lines. Voltage levels of each verify voltage may be determined according to position information associated with a corresponding one of the word lines.

In at least some example embodiments, the non-volatile memory device may be a NAND flash memory including word lines divided into a first word line group and a second word line group. The first word line group may include at least one word line, wherein each of the at least one word lines are not adjacent to a string select line or a ground select line. The second word line group may include at least one word line, wherein each of the at least one word lines are adjacent to the string select line or the ground select line. The second word line group may have an erase speed different from (e.g., faster or slower than) an erase speed of the first word line group. A verify voltage of the second word line group may be different from (e.g., higher than) the verify voltage of the first word line group by a given voltage.

At least one other example embodiment provides a non-volatile memory device. The non-volatile memory device may include a memory cell array, a verify voltage generator and a voltage controller. The memory cell array may include a plurality of word lines and a plurality of bit lines, which intersect each other. The verify voltage generator may generate a verify voltage during a first (e.g., programming or erasing) operation. The verify voltage may be applied to a word line selected from the word lines. The voltage controller may determine a voltage level of the verify voltage according to position information of the selected word line. The non-volatile memory device may be a NAND flash memory.

According to at least some example embodiments, the word lines may be divided into a first word line group and a second word line group. The first word line group may include at least one word line, wherein each of the at least one word lines are not adjacent to a string select line or a ground select line. The second word line group may include at least one word line, wherein each of the at least one word lines are adjacent to the string select line or the ground select line. The second word line group may have an erase speed different from (e.g., faster or slower than) an erase speed of the first word line group. A verify voltage of the second word line group may be different from (e.g., higher than) the verify voltage of the first word line group by a given voltage.

A voltage level of a read voltage of the second word line group may be different from (e.g., lower than) a read voltage of the first word line group by the first voltage level during a read operation. An erase speed of the second word line group may be different from (e.g., faster or slower than) an erase speed of the first word line group. The voltage controller may raise a voltage level of a verify voltage of the second word line group by a second voltage level compared to a voltage level of a verify voltage of the first word line group during an erase operation.

According to at least one other example embodiment of a non-volatile memory device, a memory cell array may include a plurality of word lines and a plurality of bit lines, which intersect each other. A row decoder may receive a row address and select one of the word lines based on the received row address. A page buffer may read data from the memory cell array, and a pass/fail check circuit may determine whether a first operation has passed or failed based on data output from the page buffer and pass data during a verify operation. A word line voltage generating circuit may generate a program/erase/read/verify voltage to be applied to the selected word line, and apply verify voltages having different voltage levels to the selected word lines according to location information of the selected word lines during the first operation. The first operation may be a programming or erasing operation.

According to at least one other example embodiment a non-volatile memory device may include a word line voltage control circuit. The word line voltage control circuit may be configured to generate a verify voltage during a first operation and apply the generated verify voltage to a word line selected from a plurality of word lines. The voltage level of the verify voltage may be determined according to position information associated with the selected word line.

BRIEF DESCRIPTION OF THE DRAWINGS

The accompanying figures are included to provide a further understanding of the present invention, and are incorporated in and constitute a part of this specification. The drawings illustrate example embodiments and, together with the description, serve to explain principles of the present invention. In the figures.

DETAILED DESCRIPTION OF EXAMPLE EMBODIMENTS

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Non-volatile memory devices according to example embodiments and programming and erasing methods thereof provide verify voltages of different respective voltage levels according to position information of each word line to perform a program/erase operation. Consequently, a program/read speed of the non-volatile memory device may be improved.

Figure 3:
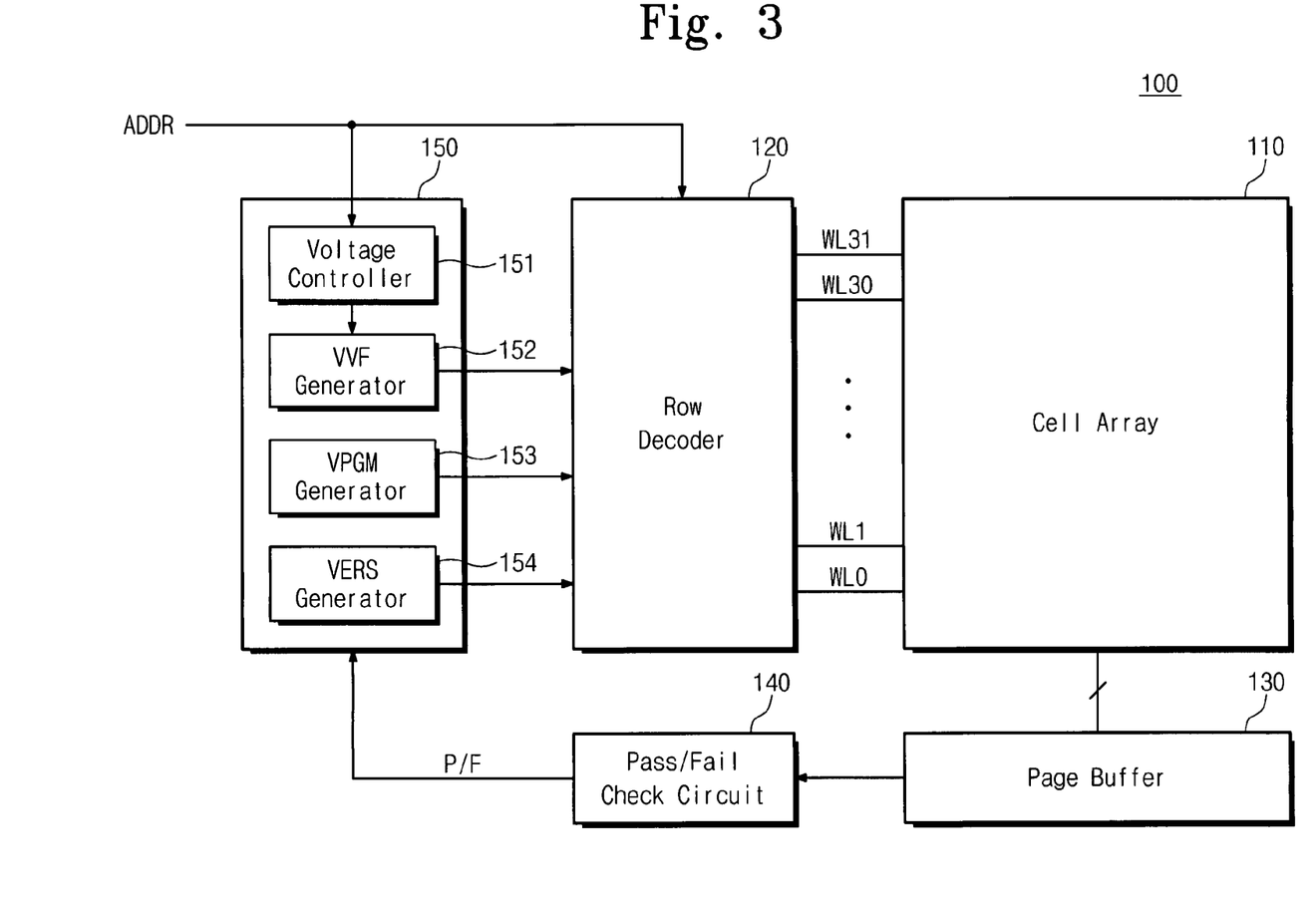
FIG. 3 is a block diagram of a non-volatile memory device according to an example embodiment.

FIG. 3 is a block diagram of a non-volatile memory device according to an example embodiment. However, it is apparent to those skilled in the art that example embodiments may be applicable to other memory devices such as mask read only memory (MROM), programmable read only memory (PROM), ferroelectric random access memory (FRAM), etc., other than flash memory devices.

Referring to FIG. 3, the non-volatile memory device 100 may include a memory cell array 110, a row decoder 120, a page buffer 130, a pass/fail check circuit 140, and a word line voltage control circuit 150. The word line voltage control circuit 150 may apply verify voltages VVF having different voltage levels to corresponding word lines according to position information of each word line during a program/erase operation.

For example, assuming word lines WL0 and WL31 are programmed slower relative to other word lines WL1 to WL30, a verify voltage VVF applied to the word lines WL0 and WL31 by the word line voltage control circuit 150 during a program operation may be lower than the verify voltage applied the word lines WL1 to WL30 by a given voltage level. On the contrary, assuming that word lines WL0 and WL31 are programmed faster relative to other word lines WL1 to WL30, a verify voltage VVF applied to the word lines WL0 and WL31 by the word line voltage control circuit 150 during a program operation may be higher than the verify voltage applied to the word lines WL1 to WL30 by a given voltage level.

On the other hand, assuming that word lines WL0 and WL31 are erased slower relative to word lines WL1 to WL30, a verify voltage VVF applied to the word lines WL0 and WL31 by the word line voltage control circuit 150 during an erase operation may be higher than the verify voltage applied to the word lines WL1 to WL30 by a given voltage level. On the contrary, assuming that word lines WL0 and WL31 are erased faster relative to word lines WL1 to WL30, a verify voltage VVF applied to the word lines WL0 and WL31 by the word line voltage control circuit 150 during an erase operation may be lower than the verify voltage applied to the word lines WL0 and WL31 by a given voltage level.

The memory cell array 110 may include a plurality of memory cell structured in the same or substantially the same manner as the memory cell array of FIG. 1. A plurality of word lines and a plurality of bit lines may intersect in each memory cell of the memory cell array 110. Each memory cell may store 1-bit data or multi-bit (e.g., n-bit) data (where n is an integer above two).

The row decoder 120 (e.g., a word line select circuit) may decode a row address ADDR provided from a row address buffer (not shown) and select at least one of the word lines in the memory cell array 110. A voltage generator 153 may provide a word line voltage to the selected word line. The word line voltage applied to each word line may be used during a read, program and/or erase operation. The row address ADDR decoded in the row decoder 120 may correspond to position information of the selected word line. The word line voltage control circuit 150 may determine a voltage level to apply or provide to each word line based on or in response to the decoded row address ADDR.

The page buffer 130 may read data from the memory cell array 110 during a read/verify operation. The data read during the read operation may be output through an input/output circuit (not shown). In another example, the data read during a verify operation may be output to the pass/fail check circuit 140. The page buffer 130 may be controlled by a control circuit (not shown). The control circuit may control general operations of the non-volatile memory device 100. The page buffer 130 may drive bit lines through a program voltage (e.g., a ground voltage) or a program prohibit voltage (e.g., a power voltage) based on the input data.

The pass/fail check circuit 140 may determine whether the data values output from the page buffer 130 are identical in order to determine whether to pass data or not during a program/erase operation. The pass/fail check circuit 140 may be output a pass/fail signal P/F as the result of the program/erase operation to the word line voltage control circuit 150.

The word line voltage control circuit 150 may control a word line voltage applied to the word lines WL0 to WL31 during a program/erase operation.

Referring still to FIG. 3, the word line voltage control circuit 150 may include a voltage controller 151, a verify voltage generator 152, a program voltage generator 153, and an erase voltage generator 154.

The voltage controller 151 may determine a voltage level of a verify voltage VVF based on or according to the input row address ADDR. The verify voltage generator 152 may generate the verify voltage VVF having a voltage level determined in the voltage controller 151, and output the generated verify voltage VVF to the row decoder 120.

The non-volatile memory device 100 may provide verify voltages VVF having different voltage levels according to position information associated with each word line during a program /erase operation. These operations may improve program and/or erase speeds.

The non-volatile memory device 100 may provide verify voltages VVF, each of which may have a different voltage level. The non-volatile memory device 100 providing verify voltages having different levels to two word line groups will be described below. The two word line groups may include a first word line group and a second word line group. The first word line group may be relatively far from the string select line SSL and the ground select line GSL. For example, the first word line group may include word lines that are not adjacent to the ground select line GSL or the string select line SSL. The second word line group may be adjacent to the string select line SSL and the ground select line GSL.

Figure 4:
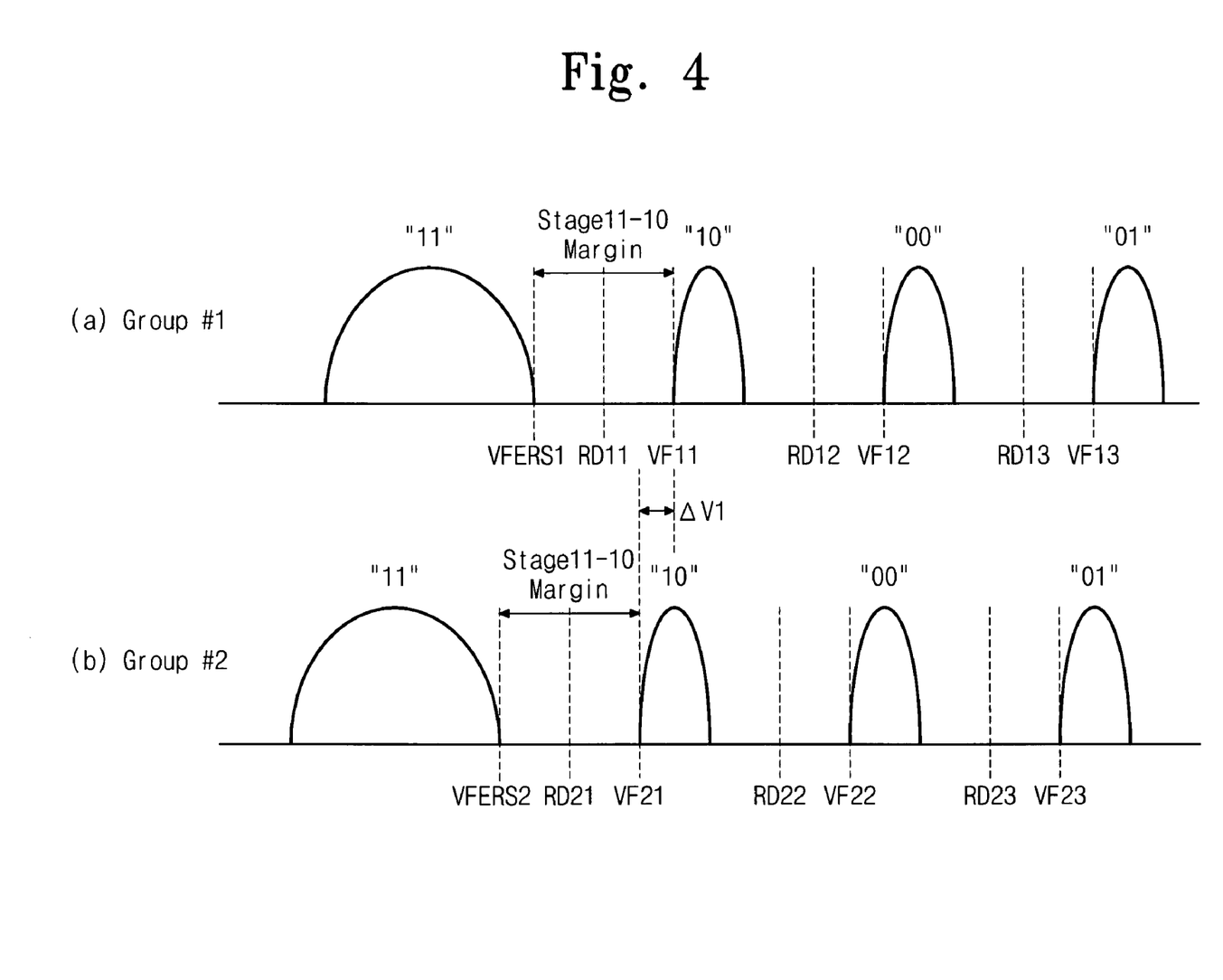
FIG. 4 is a view illustrating threshold voltage distribution of a word line with a relatively slow program operation in a non-volatile memory device according to an example embodiment.

FIG. 4 illustrates example threshold voltage distributions of word lines with a relatively slow program operation in the non-volatile memory device of FIG. 3. More particularly, (a) illustrates a threshold voltage distribution of the first word line group and (b) shows a threshold voltage distribution of the second word line group. The second word line group may have a slower program speed than the first word line group.

Referring to FIG. 4, in the case of the second word line group, when applying a program voltage identical or substantially identical to that of the first word line group, threshold voltage distributions of 11, 10, 00, and 01 may be formed as shown in (b).

As shown in (a), the verify voltage VVF of the first word line group may be defined as VF11, VF12 and VF13, whereas the verify voltage VVF of the second word line group may be defined as VF21, VF22 and VF23. The verify voltages VF21, VF22 and VF23 may have voltage levels lower than corresponding verify voltages VF11, VF12 and VF13, respectively, by $\Delta V1$.

During a program operation, the verify voltage generator 152 may apply VF11, VF12, and VF13 as voltage levels of the verify voltages VVF to the first word line group. On the other hand, during a program operation, the verify voltage generator 152 may apply VF21, VF22 and VF23 as voltage levels of the verify voltages VVF to the second word line group. Read voltages RD21, RD22 and RD23 and an erase verify voltage VFERS2, which may be lower by $\Delta V1$ compared to read voltages for the first word line group, may be provided to the second word line group. Accordingly, margins of cell states 11, 10, 00 and 01 may be maintained more consistently.

Figure 5:
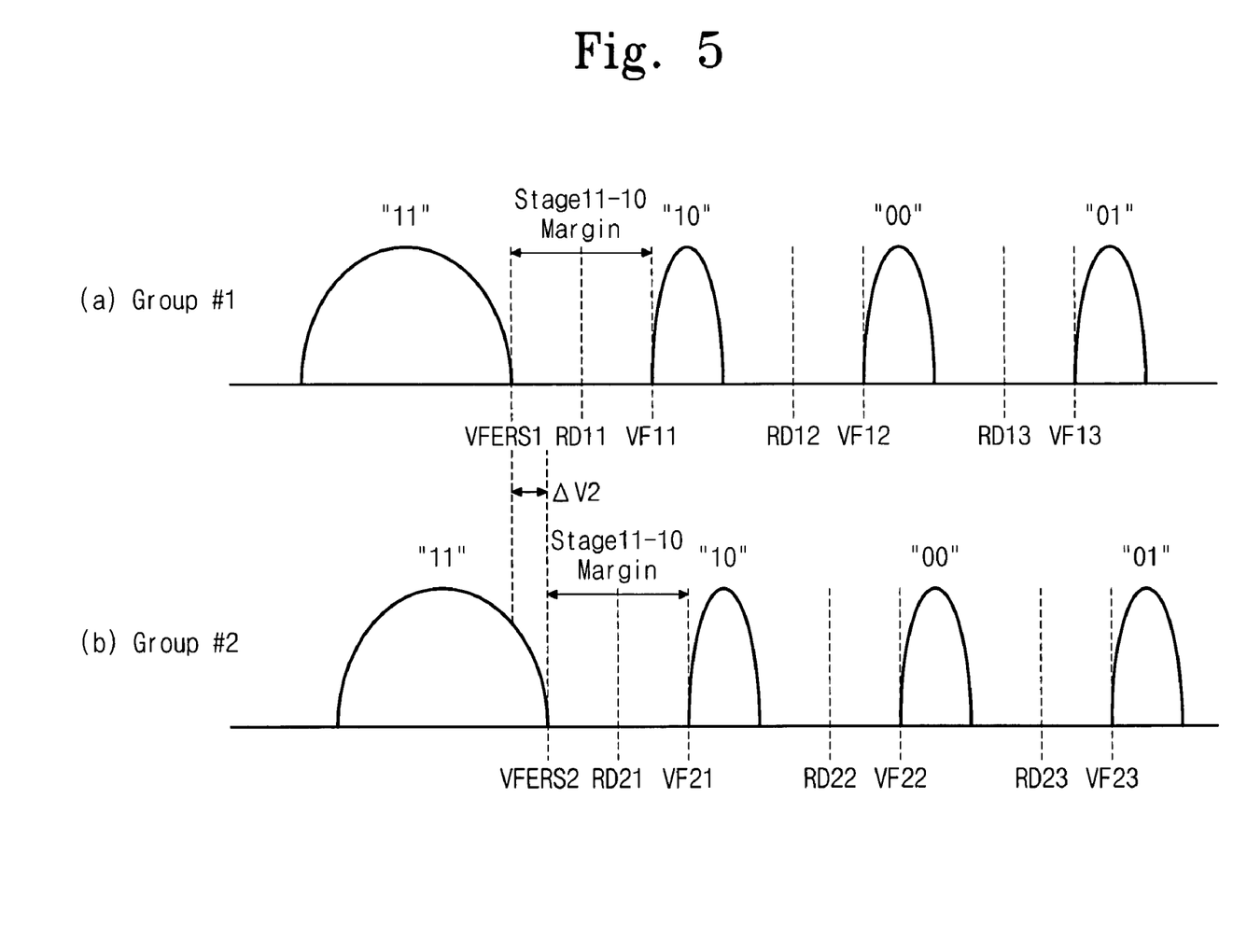
FIG. 5 is a view illustrating threshold voltage distribution of a word line with a relatively slow program operation in a non-volatile memory device according to an example embodiment.

FIG. 5 is a view illustrating an example threshold voltage distribution of a word line with a relatively slow program operation in the non-volatile memory device 100. Referring to FIG. 5, (a) is an example threshold voltage distribution of the first word line group, whereas (b) is an example threshold voltage distribution of the second word line group. The second word line group may have a slower erase speed than the first word line group.

Referring to FIG. 5, in a case of the second word line group, when applying a program voltage like the first word line group, threshold voltage distribution of 11 may be formed as shown in (b). As shown in (a), an erase verify voltage VVF of the first word line group may be VFERS1, whereas the erase verify voltage VVF of the second word line group may be VFERS2 as shown in (b). VFERS2 may be a voltage level that is greater than VFERS1 by $\Delta V1$.

During an erase operation, the verify voltage generator 152 may apply an erase verify voltage VVF having a voltage level of VFERS1 to the first word line group. On the other hand, during a program operation the verify voltage generator 152 may apply a verify voltage VVF having a voltage level VFERS2 to the second word line group.

Read voltages RD21, RD22 and RD23 and the erase verify voltage VFERS2, which may be greater than VFERS1 by $\Delta V2$, may be provided to the second word line group. Accordingly, margins of cell states 11, 10, 00 and 01 may be maintained more consistently.

Figure 6:
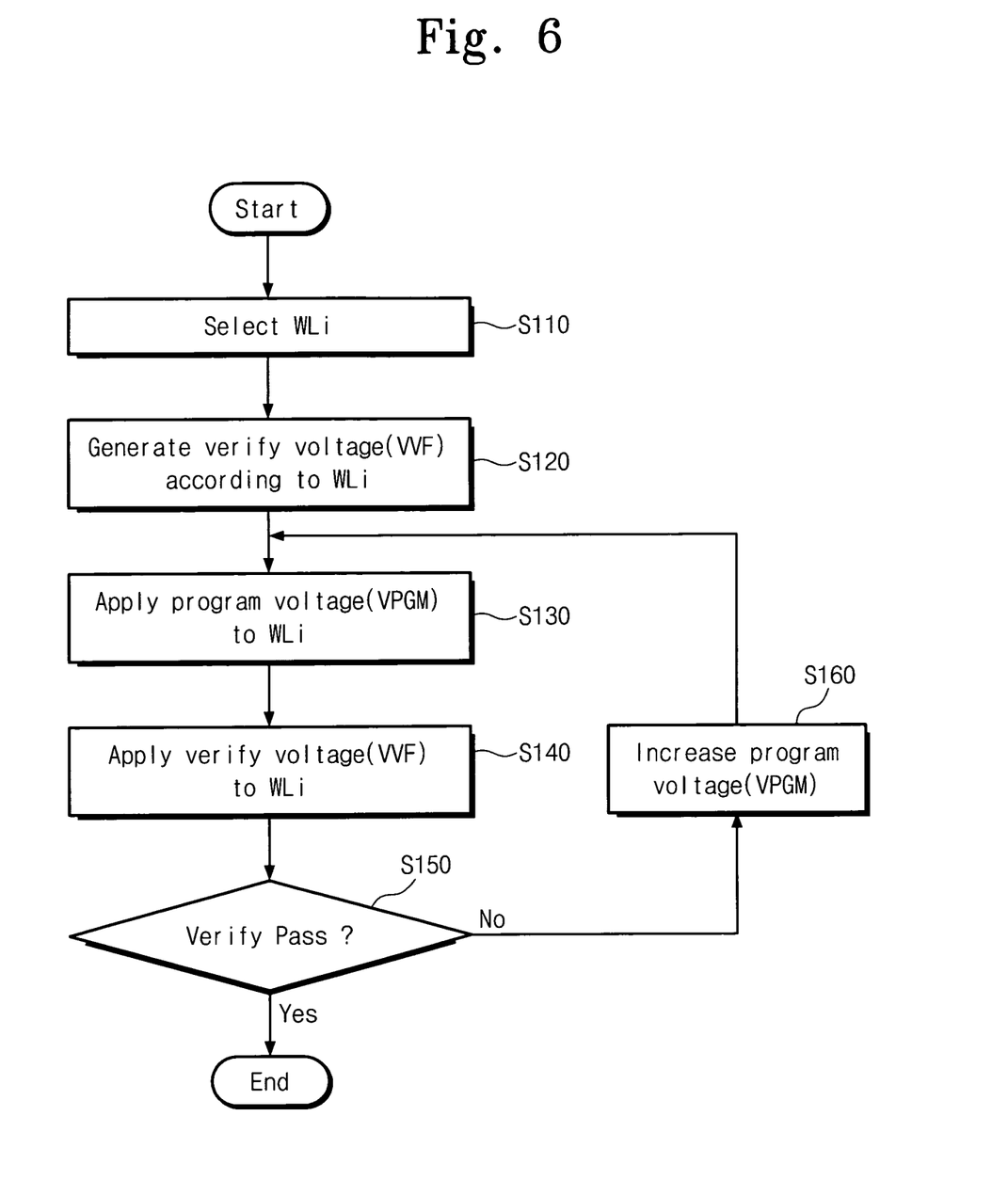
FIG. 6 is a view illustrating a program method of a non-volatile memory device according to another example embodiment.

FIG. 6 is a view illustrating a method of programming a non-volatile memory device according to an example embodiment. The method of FIG. 6 will be described with regard to the non-volatile memory device shown in FIG. 3. However, it will be understood that the method shown in FIG. 6 may be applicable to other memory devices.

Referring to FIGS. 3 and 6, at S110 the row decoder 120 may select a word line WLi according to or based on an input row address ADDR. The row address ADDR may represent location information of the word line WLi. The row address ADDR may be input to the word line voltage control circuit 150 from an external source.

At S120, the voltage controller 151 of the word line voltage control circuit 150 may determine a voltage level of the verify voltage VVF according to or based on the input row address ADDR. The verify voltage generator 152 may generate a verify voltage VVF of a voltage level corresponding to the word line WLi according to the voltage level determined by the voltage controller 151. Although FIG. 6 illustrates step S120 being performed prior to step S130, step S120 may be performed after step S130 in alternative example embodiments.

Referring still to FIG. 6, at S130 the program voltage generator 153 of the word line voltage control circuit 150 may apply a program voltage VPGM to a word line WLi at a given time. Accordingly, the memory cell array 110 may perform a program operation on memory cells (not shown) connected to the word line WLi. In one example, the memory cell array 110 may perform a program operation on a page of memory cells corresponding to the word line WLi. After performing the program operation, the non-volatile memory device 100 may perform a verify operation to determine whether the corresponding page is properly programmed or not.

At S140, the verify voltage generator 152 of the word line voltage control circuit 150 may perform a verify operation by applying the verify voltage VVF to word line WLi. A voltage level of the verify voltage VVF may vary according to the input row address ADDR. For example, as illustrated in FIG. 4, when the word line WLi is included in the second word line group, the verify voltage generator 152 may apply verify voltages VF21, VF22 and VF23, which have voltage levels lower than that of the first word line group by a given voltage level.

At S150, the pass/fail check circuit 140 may determine whether the verify operation is a pass or a fail. In one example, the page buffer 130 may read data of a corresponding page using the verify voltage VVF provided at S140. The page buffer 130 may output the read data to the pass/fail check circuit 140. The pass/fail check circuit 140 may determine whether the data values output by the page buffer 130 are the same or substantially the same as pass data. The pass/fail check circuit 140 may determine a pass or a fail based on whether the received data values are the same as the pass data.

At S150, if the pass/fail check circuit 140 determines that the program verify operation is a pass, a program operation of the non-volatile memory device 100 is complete. If the pass/fail check circuit 140 determines that the program verify operation has failed, the pass/fail check circuit 140 may output a fail signal P/F and the process may proceed to S160.

At S160, the program voltage generator 153 may increase a voltage level of the program voltage VPGM in response to a fail signal P/F from the pass/fail check circuit 140. The process may then return to S130 and repeat.

Figure 7:
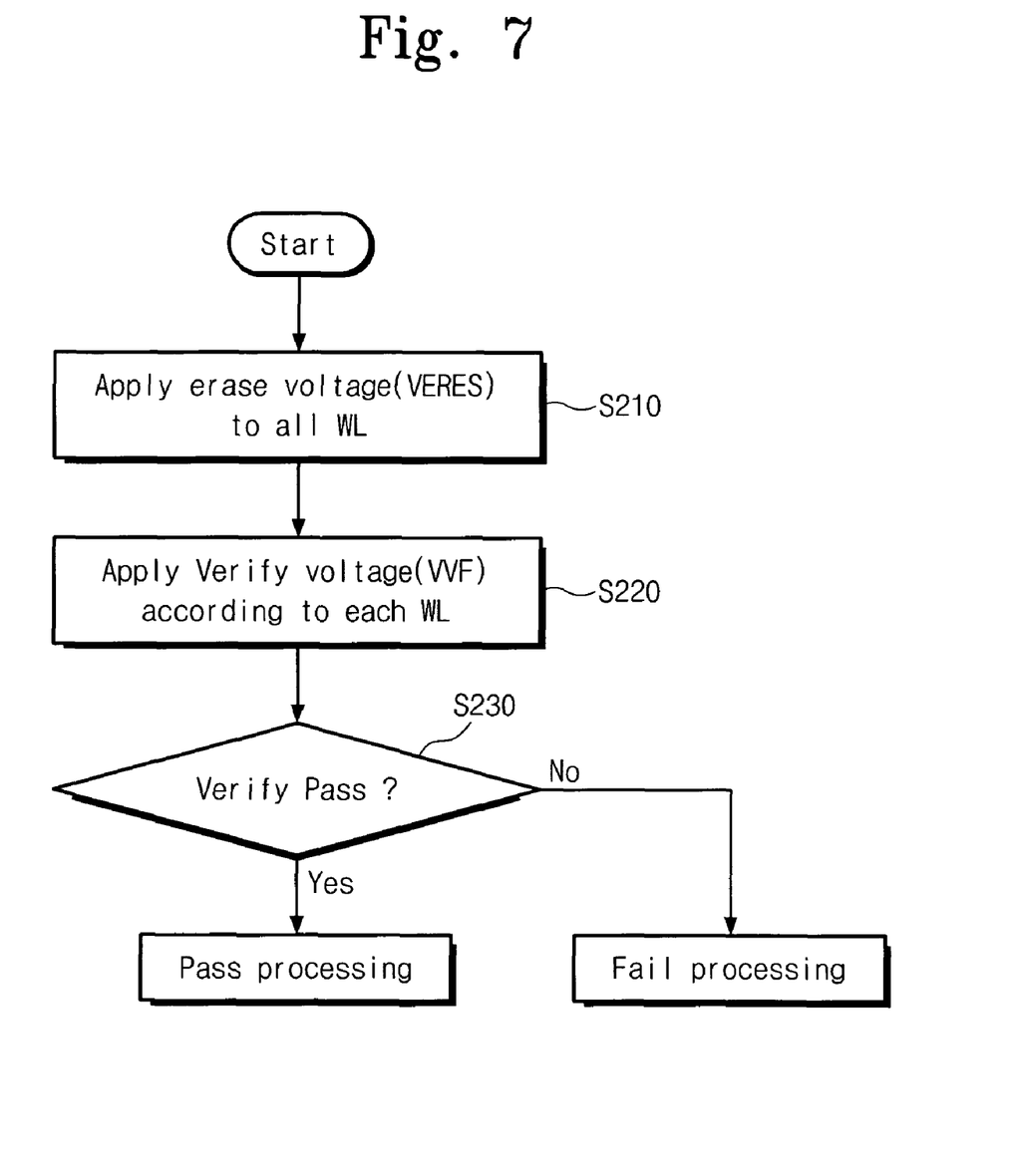
FIG. 7 is a view illustrating an erase operation of a non-volatile memory device according to another example embodiment.

FIG. 7 is a view illustrating an erase operation of a non-volatile memory device according to an example embodiment. The erase operation shown in FIG. 7 will be described with regard to the non-volatile memory device shown in FIG. 3. However, it will be understood that the method shown in FIG. 7 may be applicable to other memory devices.

Referring to FIGS. 3 and 7, at S210 the erase voltage generator 154 of the word line voltage control circuit 150 may apply an erase voltage VERS to one or more (e.g., all or substantially all) word lines WL0 to WL32. The non-volatile memory device 100 may then perform a verify operation S220, S230 to determine whether the erase operation has been properly performed.

At S220, the voltage controller 151 of the word line voltage control circuit 150 may generate verify voltages VVF having different voltage levels according to position information of each word line. The verify voltage generator 152 may apply the verify voltages VVF generated by the voltage controller 151 to word lines. For example, as illustrated in FIG. 5, the verify voltage generator 152 may generate verify voltages VERS1 and VERS2 having different voltage levels. The verify voltage VERS1 of a first voltage level may be applied to a first word line group, whereas verify voltage VERS2 of a second voltage level may be applied to the second word line group.

At S230, the pass/fail check circuit 140 may determine whether the verify operation is passed or failed. In this example, the page buffer 130 may read data of a corresponding page using the verify voltage VVF applied at S220 to output the read data to the pass/fail check circuit 140. The pass/fail check circuit 140 may determine whether the data values output from the buffer 130 are identical to pass data. The pass/fail check circuit 140 may determine whether the verify operation is a pass or fail based on whether the read data values are identical to pass data. If the program verify operation is passed, an erase operation of the non-volatile memory device 100 is complete and the word line voltage control circuit 150 may perform further pass processing. If the erase operation verify operation is a fail, the non-volatile memory device 110 may determine the erase operation that failed by performing further fail processing.

The non-volatile memory device 100 and program and erase methods thereof, according to example embodiments, provide verify voltages of different voltage levels according to position information of respective word lines. Consequently, different threshold voltage distributions may be formed according to position information of word lines, such that program and/or erase speeds may improve.

In non-volatile memory devices, program and erase methods according to example embodiments, verify voltages of different voltage levels may be provided according to position information of respective word lines. As a result, program and erase speeds may increase.

The above-disclosed example embodiments are to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of operating a non-volatile memory device, the method comprising:
    performing a first operation by applying a first voltage to at least one word line among a plurality of word lines, the first operation being one of a programming and erasing operation; and
    verifying the first operation by applying a verify voltage to each of the at least one word lines, voltage levels of each verify voltage being determined based on position information associated with a corresponding one of the at least one word lines.

2. The method of claim 1, wherein the first operation is a programming operation and the first voltage is a program voltage.

3. The method of claim 2, further including,
    determining whether the program operation has failed based on the verifying, and
    increasing a voltage level of the program voltage when the program operation is determined to have failed.

4. The method of claim 3, wherein the increasing of the voltage level of the program voltage is performed after the applying of the program voltage.

5. The method of claim 2, wherein the non-volatile memory device is a NAND flash memory, the NAND flash memory including a string having a plurality of word lines, the word lines being divided into a first word line group and a second word line group, the second word line group including at least one word line, each of the at least one word lines being adjacent to a string select line or a ground select line.

6. The method of claim 5, wherein the first word line group includes at least one word line, and wherein
    each of the at least one word lines is not adjacent to the string select line or the ground select line.

7. The method of claim 5, wherein the second word line group has a programming speed slower than a programming speed of the first word line group.

8. The method of claim 7, wherein a verify voltage of the second word line group is lower than a verify voltage of the first word line group.

9. The method of claim 1, wherein the first operation is an erasing operation and the first voltage is an erase voltage, the erase voltage being applied to each of the plurality of word lines, and wherein each of the verify voltages has a voltage level determined based on position information associated with a corresponding one of the plurality of word lines, a different verify voltage being applied to each of at least two of the plurality of word lines.

10. The method of claim 9, wherein the non-volatile memory device is a NAND flash memory, and the plurality of word lines are divided into a first word line group and a second word line group, the second word line group including at least one word line, each of the at least one word lines being adjacent to a string select line or a ground select line.

11. The method of claim 10, wherein the first word line group includes at least one word line, and wherein each of the at least one word lines is not adjacent to the string select line or the ground select line.

12. The method of claim 11, wherein the second word line group has an erase speed slower than an erase speed of the first word line group.

13. The method of claim 12, wherein a verify voltage of the second word line group is higher than a verify voltage of the first word line group.

14. A non-volatile memory device comprising:
a word line voltage control circuit configured to generate a verify voltage during a first operation and apply the generated verify voltage to a word line selected from a plurality of word lines, the word line voltage control circuit being further configured to determine a voltage level of the verify voltage according to position information associated with the selected word line.

15. The device of claim 14, further including,
a memory cell array including the plurality of word lines and a plurality of bit lines, the plurality of word lines and plurality of bit lines intersecting one another.

16. The device of claim 15, wherein the word line voltage control circuit includes,
a verify voltage generator configured to generate the verify voltage during the first operation, and
a voltage controller configured to determine the voltage level of the verify voltage according to position information associated with the selected word line.

17. The device of claim 16, wherein the non-volatile memory device is a NAND flash memory, and the plurality of word lines are divided into a first word line group and a second word line group, the second word line group including at least one word line, each of the at least one word lines being adjacent to a string select line or a ground select line.

18. The device of claim 17, wherein the first word line group includes at least one word line, wherein each of the at least one word lines in the first word line group are not adjacent to the string select line or the ground select line.

19. The device of claim 17, wherein the first operation is a programming operation and the second word line group has a programming speed slower than a programming speed of the first word line group.

20. The device of claim 17, wherein the first operation is a programming operation and the voltage controller is further configured to decrease a voltage level of a verify voltage of the second word line group during the programming operation, the voltage level of the verify voltage of the second word line group being decreased such that the voltage level of the verify voltage of the second word line group is less than a voltage level of a verify voltage of the first word line group by a first voltage difference.

21. The device of claim 20, wherein a voltage level of a read voltage of the second word line group is lower than a voltage level of a read voltage of the first word line group by the first voltage difference during a read operation.

22. The device of claim 17, wherein the first operation is an erasing operation and an erase speed of the second word line group is faster than an erase speed of the first word line group.

23. The device of claim 17, wherein the first operation is an erasing operation and an erase speed of the second word line group is slower than an erase speed of the first word line group.

24. The device of claim 17, wherein the first operation is an erasing operation and the voltage controller increases a voltage level of a verify voltage of the second word line group during the erasing operation, the voltage level of the verify voltage of the second word line group being increased such that a voltage level of the verify voltage of the second word line group is greater than the voltage level of a verify voltage of the first word line group by a first voltage difference.

25. The device of claim 24, wherein a voltage level of a read voltage of the second word line group is lower than a voltage level of a read voltage of the first word line group by the first voltage difference during a read operation.

26. The device of claim 15, further including,
a row decoder configured to select one of the word lines based on a received row address,
a page buffer configured to read data from the memory cell array,
a pass/fail check circuit configured to determine whether the first operation is a pass or a fail based on data output from the page buffer and pass data, wherein
the word line voltage control circuit is further configured to,
generate a plurality of verify voltages, each of at least a portion of the plurality of verify voltages having a different voltage level, each voltage level being determined according to location information of a corresponding word line, and
apply the generated plurality of verify voltages to the selected word lines during the first operation.

* * * * *